United States Patent [19]

Araki

[11] Patent Number: 5,215,933
[45] Date of Patent: Jun. 1, 1993

[54] METHOD OF MANUFACTURING NONVOLATILE SEMICONDUCTOR MEMORY DEVICE

[75] Inventor: Hitoshi Araki, Yokohama, Japan

[73] Assignee: Kabushiki Kaisha Toshiba, Kawasaki, Japan

[21] Appl. No.: 940,787

[22] Filed: Sep. 4, 1992

Related U.S. Application Data

[63] Continuation of Ser. No. 695,016, May 3, 1991, abandoned.

[30] Foreign Application Priority Data

May 11, 1990 [JP] Japan .................. 2-119950

[51] Int. Cl.$^5$ .............................. H01L 21/70
[52] U.S. Cl. ........................ 437/43; 437/48; 437/52; 437/195; 437/228; 437/235
[58] Field of Search ............ 437/43, 48, 52, 193, 437/195, 228, 235, 982; 357/23.5

[56] References Cited

U.S. PATENT DOCUMENTS

| | | | |
|---|---|---|---|
| 4,007,103 | 2/1977 | Baler et al. | 204/192.3 |
| 4,676,868 | 6/1987 | Riley et al. | 156/646 |
| 4,721,548 | 1/1988 | Morimoto | 437/228 |
| 4,775,550 | 10/1988 | Chu et al. | 437/225 |
| 4,830,974 | 5/1989 | Chang et al. | 437/43 |
| 4,833,514 | 5/1989 | Esquivel et al. | 437/43 |
| 4,851,365 | 7/1989 | Jeuch | 437/43 |
| 4,983,546 | 1/1991 | Hyun et al. | 437/231 |
| 4,986,878 | 1/1991 | Malazgirt et al. | 437/231 |
| 5,013,674 | 5/1991 | Bergemont | 437/43 |

FOREIGN PATENT DOCUMENTS

| | | |
|---|---|---|
| 0056456 | 4/1983 | Japan . |
| 0191336 | 10/1984 | Japan . |
| 0014444 | 1/1987 | Japan . |
| 0219923 | 9/1987 | Japan . |
| 0098245 | 4/1989 | Japan .................. 437/982 |
| 1-171229 | 7/1989 | Japan . |
| 2-079477 | 3/1990 | Japan . |
| 2-122570 | 5/1990 | Japan . |

OTHER PUBLICATIONS

Adams et al., "Planarization of Phosphorus Doped Silicon dioxide" J. of Electrochem Soc. Feb. 1981 pp. 423–429.

Primary Examiner—Tom Thomas
Attorney, Agent, or Firm—Banner, Birch, McKie & Beckett

[57] ABSTRACT

The present invention provides a method of manufacturing a nonvolatile semiconductor memory device comprising a floating gate, a control gate, source and drain regions, and a wiring layer connected to the source or drain region. An insulation film having a flat surface is formed to fill the contact hole for the source or drain region, and an insulation film containing phosphorus is formed on the insulation film. The particular construction permits the insulation film to be uniform in thickness so as to improve the charge retaining capability of the floating gate.

9 Claims, 3 Drawing Sheets

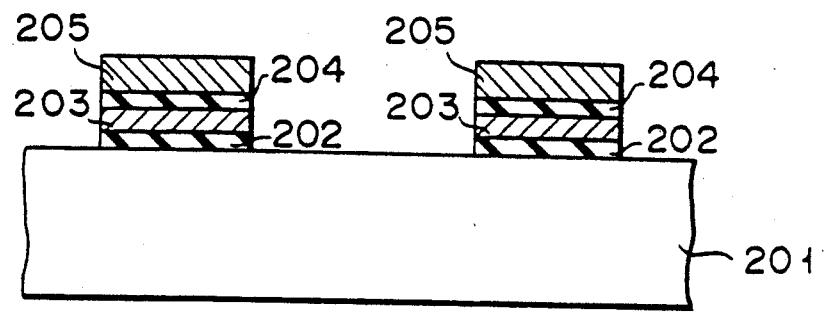
F I G. 2A
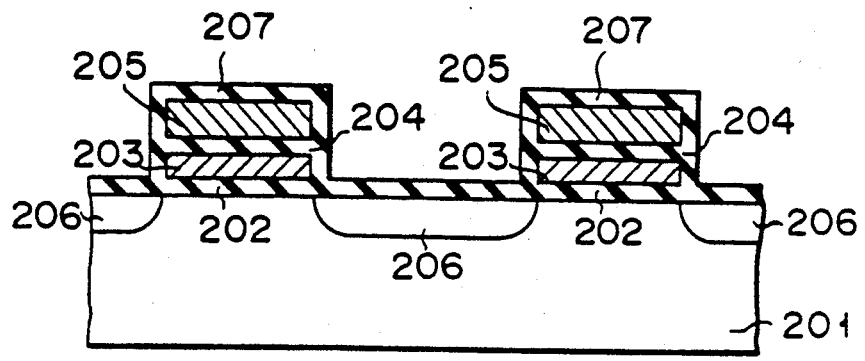
F I G. 2B

METHOD OF MANUFACTURING NONVOLATILE SEMICONDUCTOR MEMORY DEVICE

This application is a continuation of application Ser. No. 07/695,016, filed May 3, 1991 now abandoned.

BACKGROUND OF THE INVENTION

1. Field of the Invention

The present invention relates to a method of manufacturing a nonvolatile semiconductor memory device comprising gate electrode which is in an electrically floating state.

2. Description of the Related Art

In a nonvolatile semiconductor memory device, the capability of retaining the written information, i.e., written charge, is an important factor in evaluating the reliability of the memory device. The charge retaining capability depends mainly on two factors. One of the factors is the quality of the oxide film covering the floating gate. If the quality of the oxide film is poor, the charge retaining capability of the memory device is deteriorated. Mobile ions such as ions of Na, K, and Li constitute another factor. Intrusion of the mobile ions from the outside can be prevented by using a BPSG film and a PSG film as the insulation film interposed between wiring layers and as a passivation film, respectively, because the mobile ions are gettered by the phosphorus contained in the BPSG film and the PSG film. However, it is difficult to prevent the intrusion of the mobile ions completely. In the actual nonvolatile semiconductor memory device, the reliability of the memory device is restricted by the mobile ions. The mobile ions intrude into the memory device through mainly the wiring contact. In an integrated circuit which is made finer and finer nowadays, the aspect ratio of the contact hole is on a sharp increase. The high aspect ratio brings about deterioration in the step coverage of the aluminum wiring and the passivation film.

FIG. 1 shows a nonvolatile semiconductor memory device manufactured by the conventional method. As seen from the drawing, the memory device comprises a semiconductor substrate 101, a first insulation film 102, a floating gate 103, a second insulation film 104, a control gate 105, a source or drain region 106, a third insulation film 107, a fourth insulation film (BPSG film) 108, a contact hole 109, a wiring layer 110, and an insulation film (PSG film) 111 containing phosphorus. These films and layers are successively formed on the semiconductor substrate 101 using a patterning technique, etc.

In the conventional nonvolatile semiconductor memory device shown in FIG. 1, a high aspect ratio of the contact hole 109 brings about deterioration in the step coverage of the wiring layer 110 and the passivation film 111 at the portions facing the contact hole 109, with the result that the wiring layer 110 and the passivation film 111 are made very thin at the portions facing the contact hole 109. The mobile ions intrude through the thin portions of the wiring layer 110 and the passivation film 111 and migrate through the oxide film 107 so as to reach the floating gate 103 and, thus, deteriorate the charge retaining capability of the memory device.

SUMMARY OF THE INVENTION

An object of the present invention is to provide a method of manufacturing a nonvolatile semiconductor memory device which overcomes the problems noted above so as to improve the reliability, particularly, the charge retaining capability, of the nonvolatile semiconductor memory device.

According to the present invention, there is provided a method of manufacturing a nonvolatile semiconductor memory device comprising:

the step of preparing a main body of a nonvolatile semiconductor memory device including source and drain regions of a second conductivity type formed on the surface region of a semiconductor substrate of a first conductivity type, a first insulation film formed on a channel region positioned between the source and drain regions, a first gate electrode formed on the first insulation film in an electrically floating state, a second insulation film formed on the first gate electrode, a second gate electrode acting as a control electrode, which is formed via the second insulation film, third and fourth insulation films formed on the substrate including the second gate electrode, contact holes made in contact with the source or drain regions, and a first wiring layer formed on the third and fourth insulation films and within the contact holes;

the step of forming a fifth insulation film on the fourth insulation film and on the first wiring layer;

the step of planarizing (flattening) the surface of the fifth insulation film; and the step of forming a sixth insulation film containing phosphorus on the fifth insulation film.

The particular method of the present invention permits the upper portion of the contact hole to be closed with the fifth insulation film having a planarized (flattened) surface. Also, the phosphorus-containing insulation film formed on the fifth insulation film is uniform in thickness, making it possible to diminish markedly the mobile ions intruding into the nonvolatile semiconductor memory device from the outside. It follows that the present invention permits marked improvement in the charge retaining capability of the memory cell.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 2A to 2F are cross sectional views collectively showing how to manufacture a nonvolatile semiconductor memory device by a method according to one embodiment of the present invention.

DETAILED DESCRIPTION OF THE PREFERRED EMBODIMENTS

Figure 1:
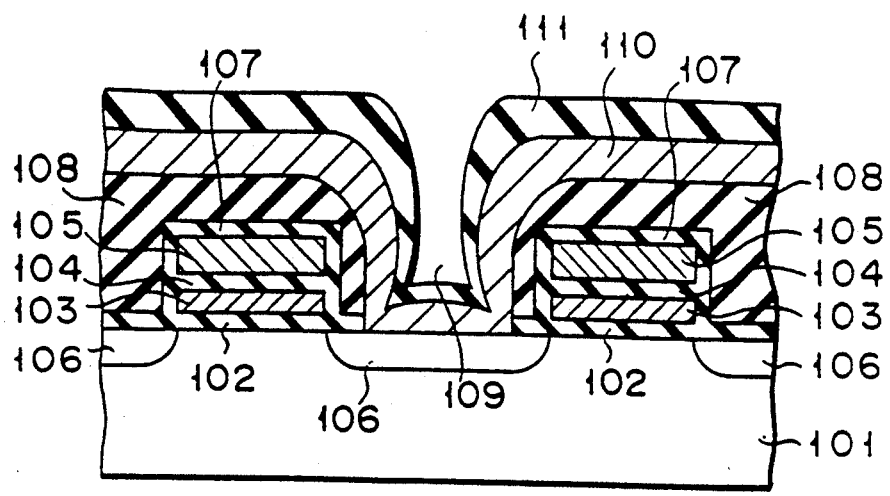
FIG. 1 is a cross sectional view showing a nonvolatile semiconductor memory device manufactured by the conventional method.
Figure 2C:
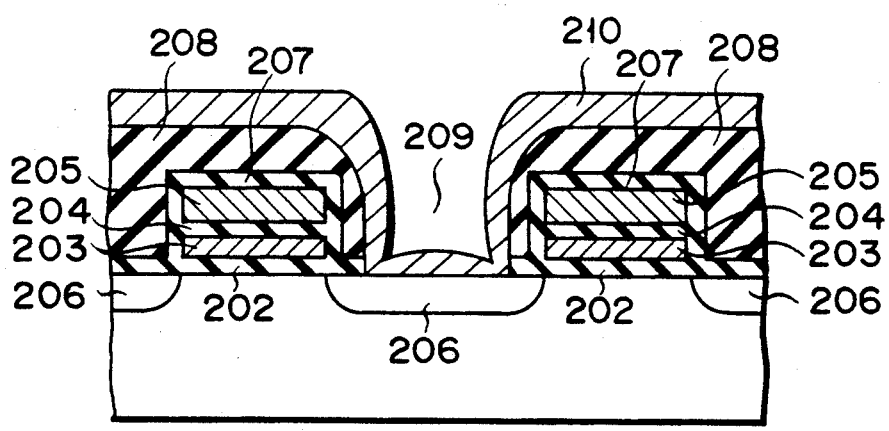

FIGS. 2A to 2F collectively show a method of manufacturing a nonvolatile semiconductor memory device according to one embodiment of the present invention. As shown in FIG. 2A, a first insulation film 202 consisting of silicon dioxide is formed in a thickness of 200 Å on a semiconductor substrate 201 consisting of a p-type monocrystalline silicon. A laminate structure consisting of a first gate electrode 203 in direct contact with the first insulating film 202, a second insulation film 204 formed on the first gate electrode 203, and a second gate electrode 205 formed on the second insulation film 204 is formed on the first insulation film 202. The first gate electrode 203 acts as a floating gate and is prepared by depositing a polycrystalline silicon in a thickness of 2000 Å. The second insulation film 204 consists of a silicon dioxide film 300 Å thick. Further, the second gate electrode 205 acts as a control electrode and is of a laminate structure 5000 Å thick, which consists of a polycrystalline silicon film and a silicide film. The laminate structure consisting of the films 202 to 205 is patterned so as to obtain a structure as shown in FIG. 2A.

Figure 2D:
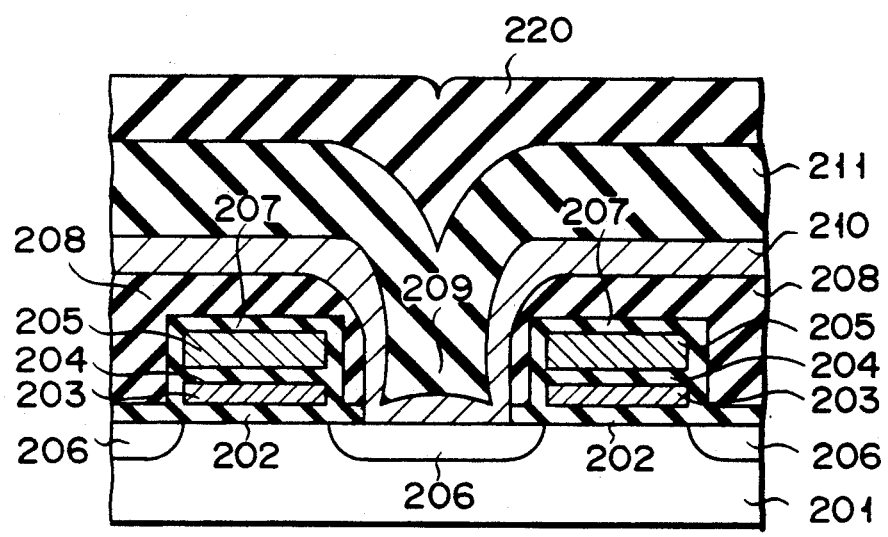
Figure 2E:
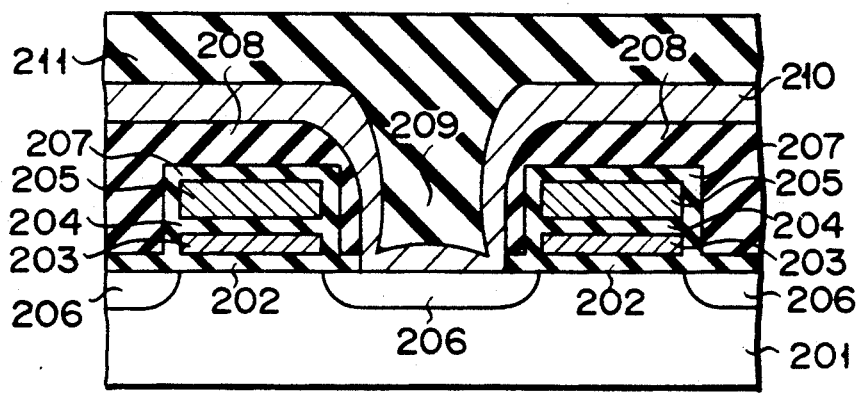
Figure 2F:
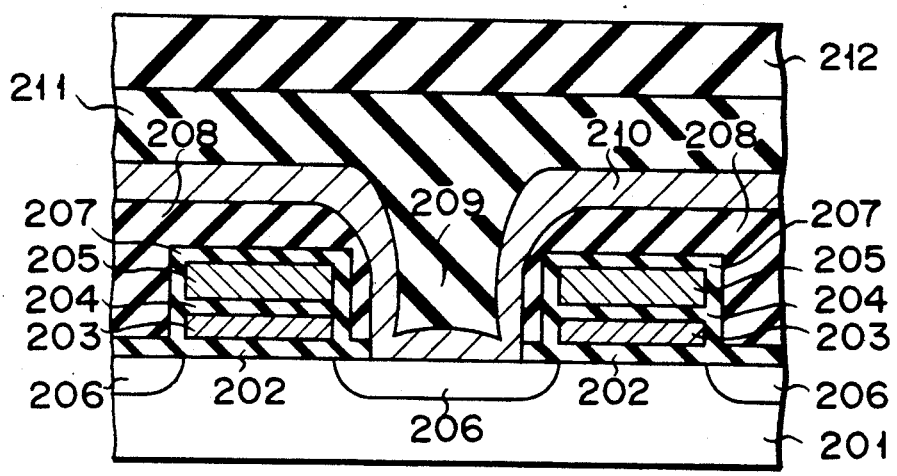

In the next step, diffusion layers 206 providing a source region and a drain region are formed within the semiconductor substrate 201, as shown in FIG. 2B. An ion implantation of an n-type impurity, e.g., arsenic or phosphorus, is employed for forming the diffusion layers 206, with the gate laminate structure shown in FIG. 2A used as a mask. After formation of the diffusion layers 206, an insulation film 207 covering the substrate surface including the upper and side surfaces of the gate electrode 205 and the side surface of the gate electrode 203 is formed by thermal oxidation, followed by depositing a phosphorus-containing insulation film (BPSG film) 208, as shown in FIG. 2C. Then, a contact hole 209 is selectively formed in contact with the source or drain region 206, followed by forming an aluminum wiring layer 210. After formation of the aluminum wiring layer 210, a silicon oxide insulation film 211 is deposited on the aluminum wiring layer 210 by CVD (chemical vapor deposition) method at a temperature lower than the melting point of the aluminum wiring layer, e.g., at about 400° C., as shown in FIG. 2D. It is possible to employ any of a plasma CVD method using $S_iH_4$, plasma CVD method using TEOS, and atmospheric-pressure CVD method using TEOS and $O_3$ as the low-temperature CVD method noted above.

Where the surface of the insulation film 211 is not sufficiently flat as shown in FIG. 2D, the insulation film 211 is planarized by the etchback method as shown in FIG. 2E, followed by depositing a phosphorus-containing film (PSG film) 212 in a thickness of 5000 Å, as shown in FIG. 2F. In the etchback method noted above, the insulation film 211 is coated with a resist 220 so as to fill the concavity formed on the surface of the insulation film 211, as shown in FIG. 2D. Then, the etchback is applied to the silicon oxide film 211 and the resist film 220 under the condition that the selectivity ratio of the silicon oxide film to the resist is small. If the resist 220 is partially left unremoved after the etching back treatment, the residual resist is removed so as to planarize (flatten) the surface of the silicon oxide film.

To be more specific, the resist film 220 is formed on the insulation film 211 as shown in FIG. 2D, followed by applying an etchback treatment to the resist film 220 and the insulation film 211 until the surface of the aluminum wiring layer 210 is exposed to the outside. If the concave portion of the insulation film 211 and the resist film positioned within the concave portion (or a region between adjacent wiring layers 210) are left within the contact hole portion after the etching back treatment, the residual resist film may be removed, followed by depositing again a silicon dioxide by the low temperature CVD method so as to obtain an insulation film 211 having a flat surface as shown in FIG. 2E. It is not absolutely necessary to apply the etching back treatment until the surface of the aluminum wiring layer is exposed to the outside. In other words, degree of the etchback treatment can be determined optionally as desired. Alternatively, it is desirable to form the insulation film 211 in a thickness greater than that shown in the drawing in the step shown in FIG. 2D, followed by forming a resist film on the thick insulation film. In this case, the resist film is etched back, and the etchback is applied to reach the intermediate portion of the insulation film 211 so as to obtain the insulation film 211 having a flat surface as shown in FIG. 2E. Incidentally, if the flatness of the surface of the insulation film 211 is insufficient even after the etching back treatment, it is possible to deposit again silicon dioxide by the low-temperature CVD method, followed by applying again an etching back treatment.

In the method of manufacturing a nonvolatile semiconductor memory device described above with reference to FIGS. 2A to 2F, the phosphorus-containing insulation film (PSG film) 212 is formed in a uniform thickness on the main body of the nonvolatile semiconductor memory device, making it possible to markedly improve the effect of preventing mobile ions from intruding from outside into the semiconductor memory device. In order to further improve the particular effect of the present invention, it is desirable to form the phosphorus-containing insulation film 211 by introducing, for example, a reaction gas containing phosphorus in the step of forming the insulation film 211 by the CVD method.

Figure 3:
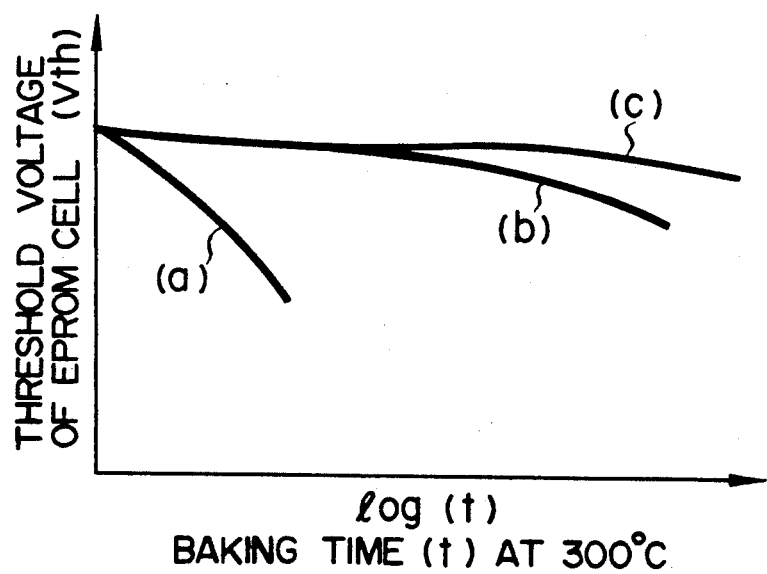
FIG. 3 is a graph showing the results of a comparative test between nonvolatile semiconductor memory devices manufactured by the conventional method and by the method of the present invention.

FIG. 3 is a graph showing the results of a high temperature baking test at 300° C., which was applied to a nonvolatile semiconductor memory device manufactured by the conventional method, said memory device constituting an EPROM (Erasable PROM), and to a nonvolatile semiconductor memory device manufactured by the method of the present invention, said memory device constituting an EPROM. The baking time [log (t)] is plotted on the abscissa in the graph of FIG. 3, with the threshold voltage of the nonvolatile semiconductor memory device being plotted on the ordinate. Curve (a) in FIG. 3 denotes the charge retaining capability of the nonvolatile memory device manufactured by the conventional method. On the other hand, curves (b) and (c) denote the charge retaining capability of the nonvolatile memory device manufactured by the method of the present invention, curve (b) covering the case where phosphorus is not contained in the insulation film 211 and curve (c) covering the case where phosphorus is contained in the insulation film 211. As clearly seen from FIG. 3, the nonvolatile semiconductor memory device manufactured by the method of the present invention is markedly advantageous in the charge retaining capability over the nonvolatile semiconductor memory device manufactured by the conventional method.

The present invention is not restricted to the embodiment described above. Of course, various modifications are available within the technical scope of the present invention. For example, a p-type monocrystalline silicon substrate was used in the embodiment described above. However, it is also possible to use an n-type monocrystalline silicon substrate in the present invention. In this case, an ion implantation of a p-type impurity, e.g., boron, is employed for forming the source and drain regions. Also, the second gate electrode 205 was formed of a laminate structure consisting of a polycrystalline silicon layer and a silicide layer in the embodiment described above. However, it is also possible to use a polycrystalline silicon layer alone or a silicide layer alone for forming the second gate electrode 205. Further, in the embodiment described above, an etchback method was employed for planarizing the surface of the insulation film 211. However, various methods including the use of inorganic or organic coating film can be employed for planarizing the surface of the insulation film 211. For example, in the method of using a coating film, an oxide film is formed on the aluminum wiring layer 210, followed by forming an inorganic or organic coating film so called spin-On-Glass (SOG) on the oxide film. Then, an etchback treatment is applied to the resultant laminate structure so as to planarize the coating film. Further, an oxide film is formed on the planarized coating film so as to provide the insulation film 211 of a laminate structure having a flat surface. The planarization (flattening) technique using a coating film also includes a method of annealing the coating formed in advance so as to provide a flat surface as shown in FIG. 2E. It should also be noted that the insulation film 211 was formed of silicon dioxide in the embodiment described above. However, it is also possible to use silicon nitride for forming the insulation film 211.

As described above in detail, the method of the present invention makes it possible to manufacture a nonvolatile semiconductor memory device exhibiting a markedly improved reliability, particularly, charge retaining capability.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of manufacturing a nonvolatile semiconductor memory device comprising the steps of:
    forming source and drain regions on a surface region of a semiconductor substrate;
    forming a first insulation film on a channel region located between the source and drain regions;
    forming a first gate electrode on the first insulation film;
    forming a second insulation film on the first gate electrode;
    forming a second gate electrode on the second insulation film;
    forming a third insulation film and a fourth insulation film on the substrate and on the second gate electrode;
    forming contact holes extending to the source and drain regions; and
    forming a first wiring layer on the third and fourth insulation films and in contact with the source and drain regions within the contact holes;
    forming a fifth insulation film on the fourth insulation film and the wiring layer;
    planarizing a surface of the fifth insulation film; and
    forming a sixth, substantially planar mobile ion gettering insulation film on the fifth insulation film.

2. The method of manufacturing a nonvolatile semiconductor memory device according to claim 1, wherein the fifth insulation film contains phosphorus.

3. The method of manufacturing a nonvolatile semiconductor memory device according to claim 1, wherein the fifth insulation film is formed at a low temperature which does not exceed the melting point of the wiring layer positioned below the fifth insulation layer.

4. The method of manufacturing a nonvolatile semiconductor memory device according to claim 1, wherein the step of planarizing the surface of the fifth insulation film includes the steps of forming a resist layer on the fifth insulation layer and etching back the resist layer and the fifth insulation film.

5. The method of manufacturing a nonvolatile semiconductor memory device according to claim 4, wherein the step of planarizing the surface of the fifth insulation film further includes the step of forming a seventh insulation film on an etched back surface.

6. The method of manufacturing a nonvolatile semiconductor memory device according to claim 1, wherein an inorganic coating film is used for forming the fifth insulation film.

7. The method of manufacturing a nonvolatile semiconductor memory device according to claim 1, wherein an organic coating film is used for forming the fifth insulation film.

8. The method of manufacturing a nonvolatile semiconductor memory device according to claim 1, wherein the sixth insulating film contains phosphorous.

9. A method of manufacturing a nonvolatile semiconductor memory device comprising the steps of:
    forming a first insulation film on a surface of a semiconductor substrate;
    forming a first conductive film on said first insulation film;
    forming a second insulation film on said first conductive film;
    forming a second conductive film on said second insulation film;
    patterning said first and second insulation films and said first and second conductive films to form a gate electrode structure including first and second gate electrodes;
    implanting ions into said semiconductor substrate using said gate electrode structure as a mask to form source and drain regions;
    forming a third insulation film on the resulting structure;
    forming a fourth insulation film on said third insulation film;
    removing portions of said third and fourth insulation films to expose one of said source or drain regions;
    forming a wiring layer on the resulting structure;
    forming a fifth insulation film on said wiring layer;
    planarizing an upper surface of said fifth insulation film; and
    forming a sixth, substantially planar, mobile ion gettering insulation film on the planarized fifth insulation film.

* * * * *